(12) United States Patent
Kanamori

(10) Patent No.: US 12,033,700 B2
(45) Date of Patent: Jul. 9, 2024

(54) MEMORY SYSTEM AND METHOD OF CONTROLLING NONVOLATILE MEMORY

(71) Applicant: Kioxia Corporation, Tokyo (JP)

(72) Inventor: Katsuya Kanamori, Yokohama (JP)

(73) Assignee: Kioxia Corporation, Tokyo (JP)

( * ) Notice: Subject to any disclaimer, the term of this patent is extended or adjusted under 35 U.S.C. 154(b) by 207 days.

(21) Appl. No.: 17/467,854

(22) Filed: Sep. 7, 2021

(65) Prior Publication Data

US 2022/0262441 A1 Aug. 18, 2022

(30) Foreign Application Priority Data

Feb. 17, 2021 (JP) ................................ 2021-023573

(51) Int. Cl.
| | |
|---|---|
| G11C 16/10 | (2006.01) |
| G11C 5/06 | (2006.01) |
| G11C 16/08 | (2006.01) |
| G11C 16/26 | (2006.01) |
| G11C 16/34 | (2006.01) |

(52) U.S. Cl.
CPC .............. G11C 16/102 (2013.01); G11C 5/06 (2013.01); G11C 16/08 (2013.01); G11C 16/26 (2013.01); G11C 16/3404 (2013.01)

(58) Field of Classification Search
CPC ......... G11C 16/102; G11C 5/06; G11C 16/08; G11C 16/26; G11C 16/3404; G11C 16/10; G11C 16/20; G11C 16/3427; G11C 16/0483
See application file for complete search history.

(56) References Cited

U.S. PATENT DOCUMENTS

| | | | |
|---|---|---|---|
| 8,332,579 B2 | 12/2012 | Nango | |
| 10,108,371 B2* | 10/2018 | Nimmagadda | ......... G06F 3/061 |
| 2019/0146709 A1 | 5/2019 | Im et al. | |
| 2019/0317691 A1 | 10/2019 | Kanno | |
| 2020/0019507 A1* | 1/2020 | Cho | .................... G06F 12/0873 |
| 2020/0192600 A1* | 6/2020 | Kanno | .................. G06F 3/0656 |

FOREIGN PATENT DOCUMENTS

| | | |
|---|---|---|
| JP | 4829365 B1 | 12/2011 |
| JP | 2019-185596 A | 10/2019 |

OTHER PUBLICATIONS

NVM Express Revision 1.2 (Year: 2014).*

* cited by examiner

*Primary Examiner* — Joshua L Schwartz
(74) *Attorney, Agent, or Firm* — Oblon, McClelland, Maier & Neustadt, L.L.P.

(57) ABSTRACT

According to one embodiment, a controller permits a host to write data to a host memory. The controller acquires from the host memory first write data having a first size, and instructs the nonvolatile memory to perform a first-step write operation for writing the first write data to a plurality of memory cells connected to a first word line. The first write data is written to the host memory by the host after the host is permitted to write data to the host memory. When the second-step write operation for the first word line becomes executable, the controller acquires the first write data again from the host memory and instructs the nonvolatile memory to perform a second-step write operation.

18 Claims, 12 Drawing Sheets

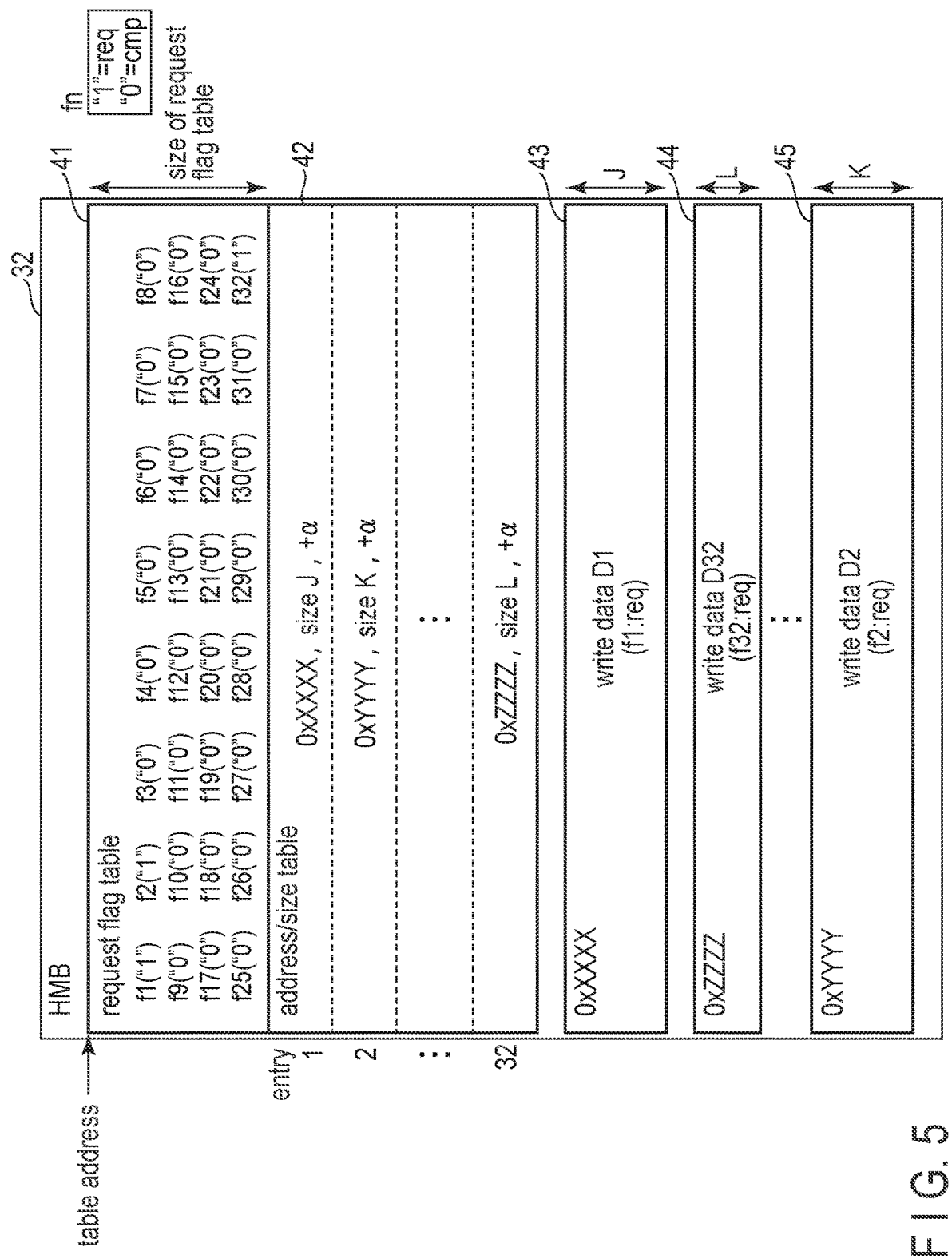
F I G. 5

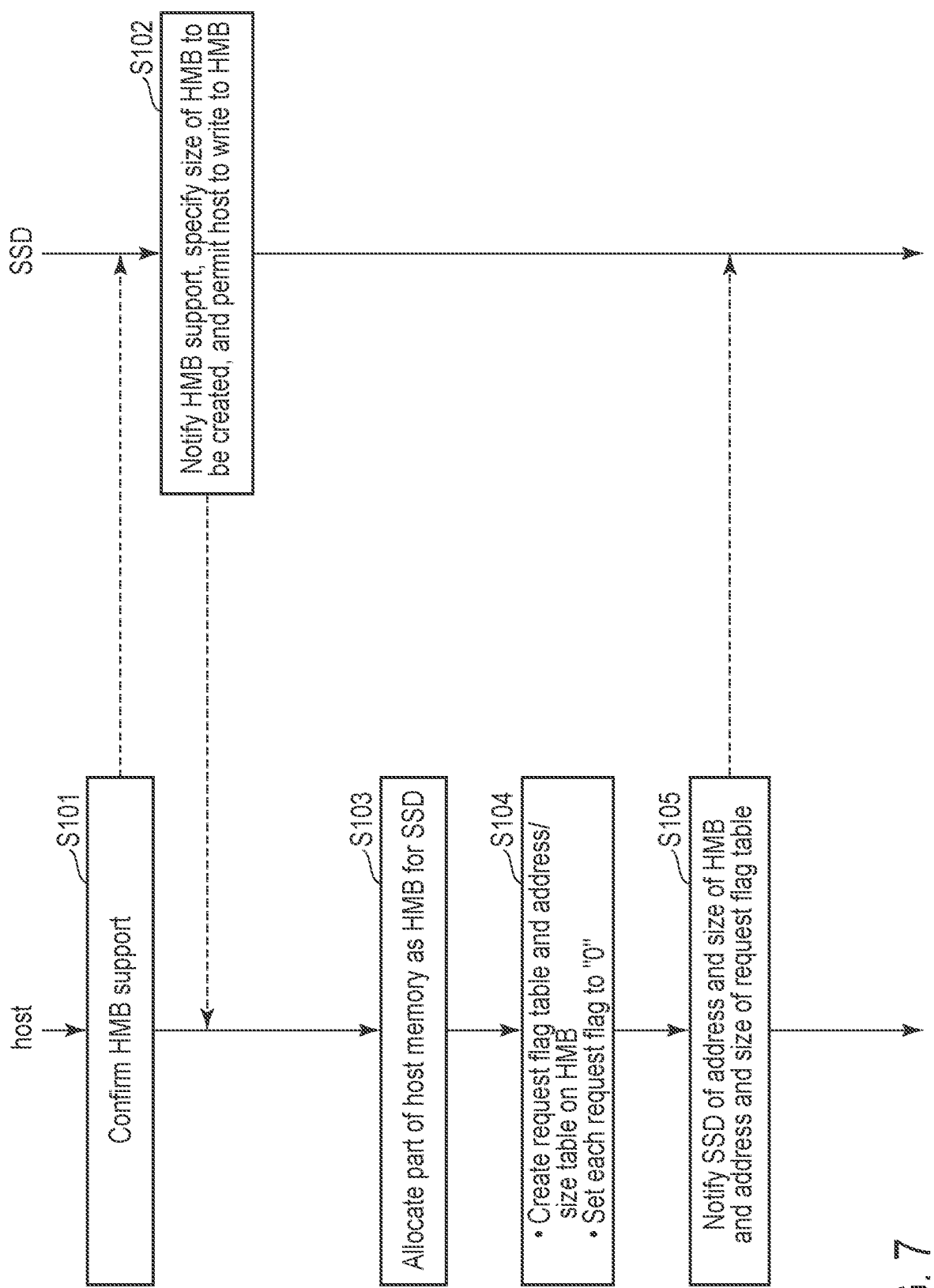
F I G. 7

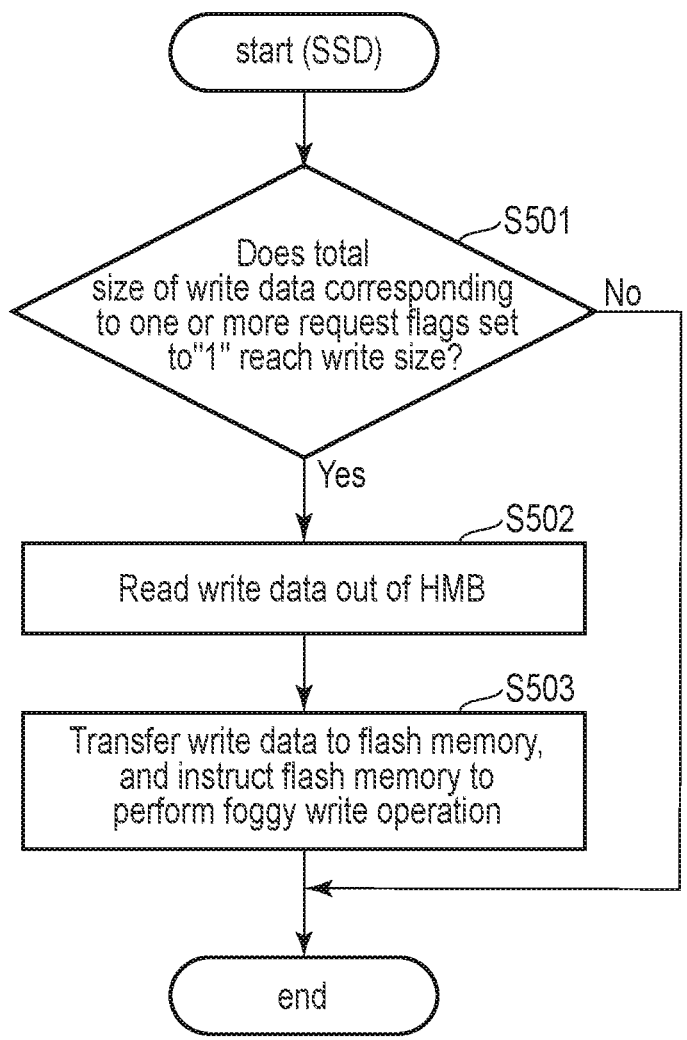
F I G. 11

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2021-023573, filed Feb. 17, 2021, the entire contents of which are incorporated herein by reference.

FIELD

Embodiments described herein relate generally to a technology of controlling a nonvolatile memory.

BACKGROUND

Memory systems implemented with a nonvolatile memory have recently become widespread. As such memory systems, a solid state drive (SSD) implemented with a NAND flash memory has been known.

In a nonvolatile memory capable of storing a plurality of bits per memory cell, a multi-step write operation may be performed to write data to the nonvolatile memory.

Until a plurality of steps of write operations that are included in the multi-step write operation are completed, write data to be written to the nonvolatile memory needs to be maintained in a write buffer in the memory system. However, a configuration of maintaining the write data in the write buffer in the memory system may be a factor in increasing memory resources required to be provided in the memory system.

BRIEF DESCRIPTION OF THE DRAWINGS

FIG. 5 is a diagram illustrating an example of a configuration of each of a request flag table and an address/size table used by the memory system according to the second embodiment.

FIG. 7 is a sequence diagram illustrating a process of initializing the host memory buffer, which is performed by the host and the memory system according to the second embodiment.

FIG. 11 is a flowchart illustrating a procedure of a write control operation of controlling a foggy write operation, which is performed in the memory system according to the second embodiment.

DETAILED DESCRIPTION

Various embodiments will be described hereinafter with reference to the accompanying drawings.

In general, according to one embodiment, a memory system is connectable to a host in accordance with an interface standard. The host includes a host memory. The memory system includes a nonvolatile memory and a controller electrically connected to the nonvolatile memory. The nonvolatile memory includes a plurality of word lines. Each of the plurality of word lines connects a plurality of memory cells. The nonvolatile memory is configured to write data having a first size to the plurality of memory cells connected to one word line by performing a multi-step write operation. The multi-step write operation includes at least a first-step write operation and a second-step write operation. The controller is configured to access a host memory defined in accordance with the interface standard in which the controller is allowed to access a location of the host memory by specifying the location using an address.

The controller permits the host to write data to the host memory. The controller acquires, from the host memory, first write data having the first size and including one or more write data respectively associated with one or more write requests. Each of the one or more write data is written to the host memory by the host after the controller permits the host to write data to the host memory. The controller transfers the first write data to the nonvolatile memory, and instructs the nonvolatile memory to perform the first-step write operation for writing the first write data to the plurality of memory cells connected to a first word line.

When the second-step write operation for the first word line becomes executable, the controller acquires the first write data again from the host memory. The controller transfers the first write data again to the nonvolatile memory and instructs the nonvolatile memory to perform the second-step write operation for writing the first write data again to the plurality of memory cells connected to the first word line.

First Embodiment

Figure 1:
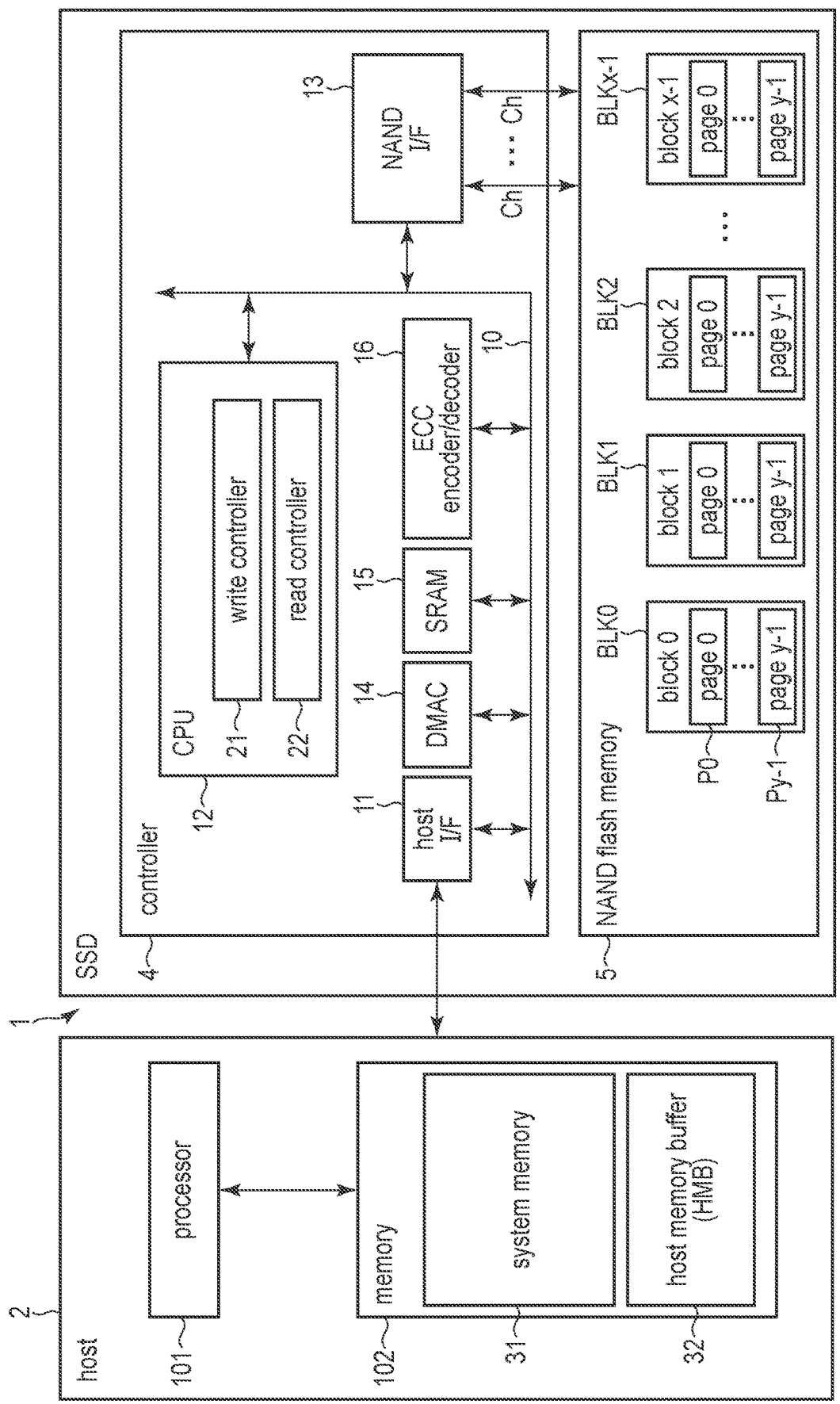
FIG. 1 is a block diagram illustrating an example of a configuration of an information processing system including a memory system according to a first embodiment.

FIG. 1 is a block diagram illustrating an example of a configuration of an information processing system 1 including a memory system according to a first embodiment. The information processing system 1 includes a host (host device) 2 and the memory system 3.

The memory system 3 is a semiconductor storage device configured to write data to a nonvolatile memory and read data from the nonvolatile memory. The memory system 3 may be implemented as, for example, a solid state drive (SSD) 3 that includes a NAND flash memory.

The SSD 3 may be connected to the host 2 via a cable or a network. Alternatively, the SSD 3 may be built in the host 2. As a standard for a logical interface for connecting the host 2 and the SSD 3, a standard of Non Volatile Memory Express™ (NVMe™) may be used.

The host 2 is an information processing apparatus configured to control the SSD 3. The host 2 is, for example, a personal computer, a server computer, a mobile terminal, or in-vehicle equipment.

The host 2 includes a processor 101 and a memory 102. The processor 101 is a central processing unit (CPU) configured to control the operation of each component in the host 2. The processor 101 executes software (host software) that is loaded into the memory 102 from the SSD 3 or another storage device connected to the host 2. The host software includes an operating system, a file system, a device driver, an application program and the like.

The memory 102 is a main memory provided in the host 2. The memory 102 may also be called a host memory. The memory 102 is implemented with a random-access memory such as a dynamic random-access memory (DRAM). A part of a memory area of the memory 102 may be used as a host memory buffer (HMB) 32 defined by the standard of NVMe. Hereinafter, the other memory areas in the memory 102 excluding the HMB 32 will be referred to as a system memory 31 for the sake of convenience.

The HMB 32 is basically used as a memory area dedicated to the SSD 3. That is, the HMB 32 is basically a memory area to which the host 2 cannot write data. This is because the host 2 is usually unable to identify a portion of the HMB 32 which is not being used by the SSD 3.

When the SSD 3 supports a function of using the host memory buffer, the host 2 allocates a part of the memory area of the memory 102 as the HMB 32 for the SSD 3, based on a size of the host memory buffer requested to be allocated by the SSD 3.

When the host 2 allocates the part of the memory area of the memory 102 as the HMB 32 for the SSD 3, the host 2 transmits a set feature command to the SSD 3 to enable the HMB 32. The set feature command includes the size of the HMB 32 that is actually allocated to the SSD 3 and a starting address indicating the location of the HMB 32 in the memory 102. After the HMB 32 is enabled, the SSD 3 can perform write access and read access to a location of the HMB 32 by specifying the location using an address. Until the enabled HMB 32 is disabled, the host 2 is basically unable to write data to the enabled HMB 32.

The host 2 can disable the HMB 32 by transmitting to the SSD 3 a set feature command for disabling the HMB 32. After the HMB 32 is disabled, the SSD 3 is unable to access the HMB 32. Therefore, before transmitting to the host 2 a command completion response for the set feature command for disabling the HMB 32, the SSD 3 performs a process of acquiring necessary data from the HMB 32.

Upon receiving from the SSD 3 the command completion response for the set feature command for disabling the HMB 32, the host 2 releases the allocation of the HMB 32 to the SSD 3. The part of the memory 102 that has been allocated as the HMB 32 is returned to the memory area for the host 2 to which the host 2 can write data.

The system memory 31 in the memory 102 is a memory area to which the host 2 can write data. The memory area of the system memory 31 is used, for example, to store software to be executed by the processor 101. A part of the memory area of the system memory 31 is also used to store one or more submission queues and one or more completion queues.

Each of the submission queues is a queue used to issue commands to the SSD 3. Each of the completion queues is a queue used to receive from the SSD 3 command completion responses each indicating the status of the completed command. The host 2 can transmit various commands to the SSD 3 via the submission queue.

The SSD 3 is configured to perform communication with the host 2 in conformity with the NVMe standard.

The interface to implement the NVMe standard includes an interface through PCI Express™ (PCIe™) bus (i.e., NVMe over PCIe), and an interface through a network such as the Ethernet™ (i.e., NVMe over Fabrics: NVMe-OF). The interface standard to which the SSD 3 conforms may be the NVMe over PCIe or may be the NVMe-OF.

The SSD 3 includes a controller 4 and a nonvolatile memory (e.g., NAND flash memory 5).

The SSD 3 may also include a random access memory, such as a DRAM. The DRAM in the SSD 3 can be used as a write buffer for temporarily storing write data to be written to the NAND flash memory 5.

In recent years, however, a DRAM-less SSD with no DRAM has been developed for the purpose of decreasing the size and cost of the SSD. The SSD 3 according to the first embodiment may also be implemented as a DRAM-less SSD.

The NAND flash memory 5 includes a memory cell array including a plurality of memory cells arranged in a matrix. The NAND flash memory 5 may be a flash memory having a two-dimensional structure or a flash memory having a three-dimensional structure.

The memory cell array of the NAND flash memory 5 includes a plurality of blocks BLK0 to BLKx-1. Each of the blocks BLK0 to BLKx-1 includes a plurality of pages (here, pages P0 to Py-1). Each of the pages includes a plurality of memory cells connected to the same word line. Each of the blocks BLK0 to BLKx-1 is a unit for a data erase operation for erasing data. Each of the pages P0 to Py-1 is a unit for a data write operation for writing data and a data read operation for reading data.

The NAND flash memory 5 is configured to store data of a plurality of bits per memory cell. For example, in a quad-level-cell flash memory (QLC flash memory) in which four-bit data is stored per memory cell, data for four pages are written to a plurality of memory cells connected to one word line. Data for one page has a size corresponding to the number of memory cells connected to one word line.

Similarly, in a triple-level-cell flash memory (TLC flash memory) in which three-bit data is stored per memory cell, data for three pages are written to a plurality of memory cells connected to one word line. In a multilevel-cell flash memory (MLC flash memory) in which two-bit data is stored per memory cell, data for two pages are written to a plurality of memory cells connected to one word line.

The NAND flash memory 5 is capable of storing data of two or more bits per memory cell. The NAND flash memory 5 may be implemented the an MLC flash memory, the TLC flash memory, the QLC flash memory, or a flash memory capable of storing data of five or more bits. The NAND flash memory 5 will be described below as implemented as the QLC flash memory, though it is not limited to the QLC flash memory.

In a modern NAND flash memory, a multi-step write operation may be applied, where a write operation for writing data is performed a plurality of times to reduce program disturb or improve the accuracy of threshold voltage distribution of memory cells. The multi-step write operation includes at least a first-step write operation and a second-step write operation.

In the first-step write operation, data for a plurality of pages is transferred to a NAND flash memory and the data is written to a plurality of memory cells connected to a write destination word line in a certain block included in the NAND flash memory. In the second-step write operation, the data for the plurality of pages is transferred again to the NAND flash memory and the data is written again to the memory cells connected to the write destination word line. As an example of the multi-step write operation in which the same data are transferred to the NAND flash memory a plurality of times, there is a foggy-fine write operation.

In the multi-step write operation such as the foggy-fine write operation, generally, the data write operation is performed while reciprocating on a plurality of word lines to reduce program disturb caused by interference between adjacent word lines.

For example, in the foggy-fine write operation that is performed by reciprocating on two word lines, first write data for a plurality of pages is transferred to the NAND flash memory and the first write data is written to the memory cells connected to a first word line (i.e., foggy write operation). Then, second write data for a plurality of pages is transferred to the NAND flash memory and the second write data is written to the memory cells connected to a second word line that is next to the first word line (i.e., foggy write operation). Then, write target memory cells are returned to the memory cells connected to the first word line, and the first write data for the plurality of pages is transferred again to the NAND flash memory and the first write data is written to the memory cells connected to the first word line (i.e., fine write operation).

The foggy write operation is a write operation for setting a threshold voltage of each of the write target memory cells coarser than a target threshold voltage distribution. That is, the threshold voltage of each memory cell is set with accuracy that is lower (coarser) than that of the target threshold voltage distribution. In the foggy write operation, the threshold voltage of each of the write target memory cells connected the word line is set with such a coarse accuracy that data cannot be correctly read from the memory cells even when the read operation for the memory cells is performed after the foggy write operation. Thus, fluctuations of the threshold voltage of each memory cell caused by writing to the adjacent word line can be absorbed in the coarsely-set threshold voltage distribution of the each memory cell.

The fine write operation is a write operation for setting (adjusting) the threshold voltage of each of the write target memory cells such that the accuracy of the threshold voltage of each of the write target memory cells is set to the target threshold voltage distribution.

When writing data to the NAND flash memory 5 by the multi-step write operation such as the foggy-fine write operation, the controller 4 of the SSD 3 is required to maintain write data to be written to the NAND flash memory 5 until the multi-step write operation is completed. For example, in a multi-step write operation including a first-step write operation (e.g., the foggy write operation) and a second-step write operation (e.g., the fine write operation), the write data transferred to the NAND flash memory 5 in the first-step write operation for a certain word line needs to be maintained until a second-step write operation for this word line is completed.

When the NAND flash memory 5 is the QLC flash memory, the size of write data written to one word line, that is, the write size of the NAND flash memory 5 corresponds to four pages. If the page size is 16 KiB, the size of write data written to one word line of the QLC flash memory is 64 KiB (=4×16 KiB). For the QLC flash memory, therefore, write data having a size of 64 KiB needs to be maintained in the SSD 3.

In addition, assuming that the write operation is the foregoing multi-step write operation, for example, the foggy-fine write operation that is performed by reciprocating on two word lines, even when the foggy write operation of first write data (64 KiB) for a first word line is completed, the fine write operation for the first word line cannot be started immediately. This is because the foggy write operation of second write data (64 KiB) for a second word line adjacent to the first word line needs to be performed before the fine write operation for the first word line is performed. The SSD 3 is thus required to maintain the second write data (64 KiB) as well as the first write data (64 KiB).

Therefore, as the size of write data to be written to one word line in the NAND flash memory 5 increases, and as the number of word lines on which the multi-step write operation is performed by reciprocating increases, the memory resources required for the SSD 3 increases.

If, however, the SSD 3 is provided with a large-capacity DRAM as a write buffer, it will increase in cost and size of the SSD 3.

In the SSD 3 according to the first embodiment, thus, when performing the multi-step write operation, the write data transferred to the NAND flash memory 5 to perform a first-step write operation (e.g., the foggy write operation) for a certain word line is not maintained in the SSD 3, but is saved to the HMB 32. This makes it possible to perform the multi-step write operation for the QLC flash memory without providing a large-capacity DRAM as a write buffer in the SSD 3.

The controller 4 may be implemented with a circuit such as a system-on-a-chip (SoC). Functions of components of the controller 4 may be implemented by dedicated hardware, a processor that executes programs (firmware), or a combination thereof.

The controller 4 controls a data write operation of writing data, which is received from the host 2, to the NAND flash memory 5 and a data read operation of reading read target data, which is requested by the host 2, from the NAND flash memory 5, by controlling the NAND flash memory 5.

The controller 4 is electrically connected to the NAND flash memory 5 via a NAND interface (I/F) 13. The NAND interface 13 conforms to the Toggle NAND flash interface or the open NAND flash interface (ONFI) though it is not limited to these interfaces. The controller 4 operates as a memory controller configured to control the NAND flash memory 5.

The controller 4 may function as a flash translation layer (FTL) configured to execute data management of the NAND flash memory 5 and block management of the NAND flash memory 5.

The data management executed by the FTL includes (1) management of mapping information indicating the relationship in correspondence between each of logical addresses and each of physical addresses of the NAND flash memory 5, (2) processing for concealing the constraint (e.g., read/write operation that is performed in a unit of a page and erase operation that is performed in a unit of a block) of the NAND flash memory 5, and the like. A logical block address (LBA) can be used as the logical address. The physical address corresponding to a certain logical address indicates a physical storage location in the NAND flash memory 5 to which data corresponding to the logical address is written. The controller 4 manages the mapping between each of the logical addresses and each of the physical addresses using a logical-to-physical address translation table (L2P table) not shown.

The controller 4 includes a host interface (I/F) 11, a CPU 12, a direct memory access controller (DMAC) 14, a static RAM (SRAM) 15 and an error correction code (ECC) encoder/decoder 16 in addition to the NAND interface 13 described above. The host interface 11, the CPU 12, the NAND interface 13, the DMAC 14, the SRAM 15 and the ECC encoder/decoder 16 are connected to each other via a bus 10.

The host interface 11 is a host interface circuit configured to perform communication with the host 2. The host interface 11 is, for example, a PCIe controller. Alternatively, when the SSD 3 is configured to incorporate a network interface controller, the host interface 11 may be implemented as a part of the network interface controller.

The host interface 11 performs communication with the host 2 in compliance with the NVMe standard. The host interface 11 receives various commands such as a write command and a read command from the host 2. The write command is a command that requests the SSD 3 to write data (i.e., write data). The write command includes a logical address (start LBA) to which the write data is to be written, the size of the write data, a data pointer (buffer address) indicating an address in the memory 102 (system memory 31) where the write data is stored, and the like. The read command includes a start LBA to which data to be read is written and the size of this data.

The host 2 stores each command in a submission queue. Command completion indicating the status of the completed command is stored in the completion queue by the host interface 11. The command and the command completion are associated with each other by, for example, a tag specified by the command.

That is, the controller 4 receives a command from the host 2 by the host interface 11 fetching the command from the submission queue, and notifies the host 2 of the command completion by the host interface 11 storing the command completion in the completion queue.

The NAND interface 13 is a NAND controller configured to control the NAND flash memory 5 under the control of the CPU 12. When the NAND flash memory 5 includes a plurality of NAND flash memory chips (NAND flash memory dies), the NAND interface 13 may be connected to the NAND flash memory chips via a plurality of channels (Ch), respectively.

The SRAM 15 is a volatile storage area. The storage area of the SRAM 15 may be used as a work area of the CPU 12, and the like.

The DMAC 14 executes data transfer between the SRAM 15 and the memory 102 of the host 2 under the control of the CPU 12.

When data is to be written to the NAND flash memory 5, the ECC encoder/decoder 16 encodes the data to be written to add an error correction code (ECC) to the data as a redundant code. When data is read from the NAND flash memory 5, the ECC encoder/decoder 16 corrects an error of the read data using the ECC added to the data.

The CPU 12 is a processor configured to control the host interface 11, the NAND interface 13, the DMAC 14, the SRAM 15 and the ECC encoder/decoder 16. The CPU 12 performs various processes by loading a control program (firmware) stored in the NAND flash memory 5 or a ROM (not shown) into the SRAM 15 and executing the firmware.

The CPU 12 can function as a write control unit 21 and a read control unit 22. A part or all of each of the write control unit 21 and read control unit 22 may be implemented by dedicated hardware in the controller 4.

The write control unit 21 controls a multi-step write operation of writing write data associated with a write command received from the host 2 to the NAND flash memory 5. This multi-step write operation may be, for example, the foggy-fine write operation described above.

The read control unit 22 is configured to instruct the NAND flash memory 5 to read data from a physical storage location corresponding to a logical address (start LBA) included in a read command received from the host 2 and transmit to the host 2 the data that is read from the NAND flash memory 5.

Figure 2:
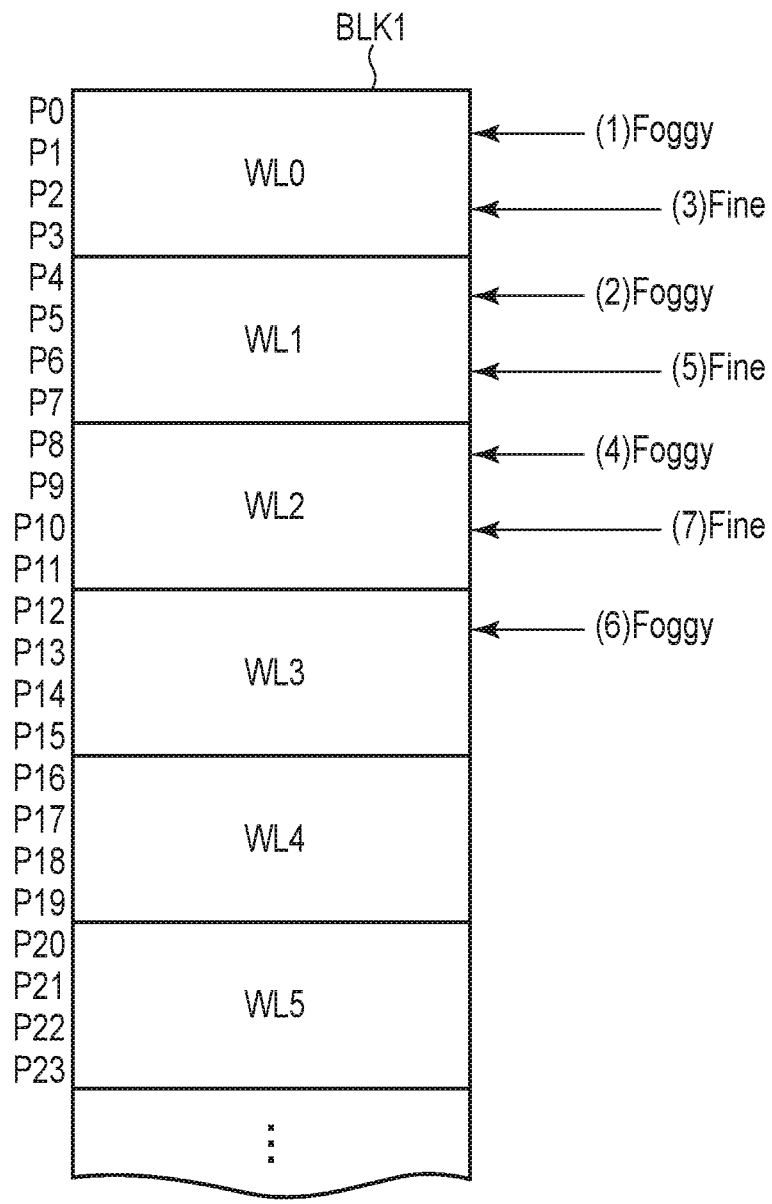
FIG. 2 is a diagram illustrating a foggy-fine write operation according to the first embodiment.

FIG. 2 is a diagram illustrating the foggy-fine write operation.

Here is an example of the foggy-fine write operation that is performed by reciprocating on two word lines. The foggy-fine write operation for a block BLK1 is performed as follows.

First, write data for four pages (P0 to P3) is transferred to the NAND flash memory 5, and the foggy-write operation is performed to write the write data for four pages to a plurality of memory cells connected to a word line WL0 in the block BLK1.

Then, write data for the next four pages (P4 to P7) is transferred to the NAND flash memory 5, and the foggy-write operation is performed to write the write data for four pages to a plurality of memory cells connected to a word line WL1 in the block BLK1.

When the foggy-write operation to write the write data to the memory cells connected to the word line WL1 is completed, a write destination word line returns to the word line WL0, and the fine-write operation can be performed to write the write data again to the memory cells connected to the word line WL0. Then, the same write data for the four pages (P0 to P3) as the write data used in the foggy-write operation for the word line WL0 is transferred again to the NAND flash memory 5, and the fine-write operation is performed to write the write data for the four pages again to the memory cells connected to the word line WL0. Thus, the foggy-fine write operation for the word line WL0 is completed. As a result, data corresponding to pages P0 to P3 can correctly be read from the block BLK1.

Then, the write destination word line becomes a word line WL2. Write data for the next four pages (P8 to P11) is transferred to the NAND flash memory 5, and the foggy-write operation is performed to write the write data for the four pages to a plurality of memory cells connected to the word line WL2 in the block BLK1.

When the foggy-write operation to write the write data to the memory cells connected to the word line WL2 is completed, the write destination word line returns to the word line WL1, and the fine-write operation can be performed to write the write data again to the memory cells connected to the word line WL1. Then, the same write data for the four pages (P4 to P7) as the write data used in the foggy-write operation for the word line WL1 is transferred again to the NAND flash memory 5, and the fine-write operation is performed to write the write data for the four pages again to the memory cells connected to the word line WL1. Thus, the foggy-fine write operation for the word line WL1 is completed. As a result, data corresponding to pages P4 to P7 can correctly be read from the block BLK1.

Then, the write destination word line becomes a word line WL3. Write data for the next four pages (P12 to P15) is transferred to the NAND flash memory 5, and the foggy-write operation is performed to write the write data for the four pages to a plurality of memory cells connected to the word line WL3 in the block BLK1.

When the foggy-write operation to write the write data to the memory cells connected to the word line WL3 is completed, the write destination word line returns to the word line WL2, and the fine-write operation can be performed to write the write data again to the memory cells connected to the word line WL2. Then, the same write data for the four pages (P8 to P11) as the write data used in the foggy-write operation for the word line WL2 is transferred again to the NAND flash memory 5, and the fine-write operation is performed to write the write data for the four pages again to the memory cells connected to the word line WL2. Thus, the foggy-fine write operation for the word line WL2 is completed. As a result, data corresponding to pages P8 to P11 can correctly be read from the block BLK1.

Figure 3:
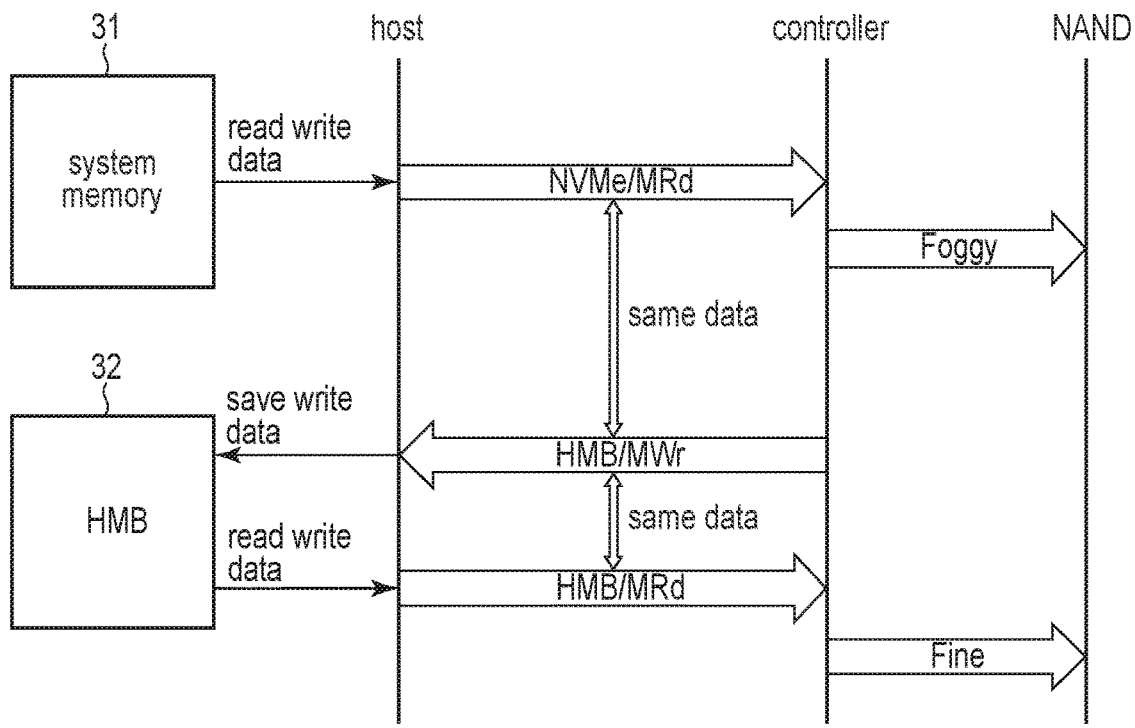
FIG. 3 is a diagram illustrating a write control operation performed in the memory system according to the first embodiment.

FIG. 3 is a diagram illustrating a write control operation performed in the SSD 3 according to the first embodiment.

First, the controller 4 receives one or more write commands from the host 2. When the total size of write data to be written reaches the write size of the NAND flash memory 5 (e.g., four pages), the controller 4 reads the write data from the system memory 31 (NVMe/MRd in FIG. 3). The write size is a size of data capable of being stored in a plurality of memory cells connected to one word line. The write size is thus equal to a data size obtained by multiplying the page size by the number of bits that can be stored in each memory cell. In other words, the write size is equal to a data size obtained by multiplying the number of memory cells connected to the word line by the number of bits that can be stored in each memory cell.

Then, the controller 4 transfers the write data read from the system memory 31 to the NAND flash memory 5, and instructs the NAND flash memory 5 to perform the foggy-write operation for writing the write data to a plurality of memory cells connected to the write destination word line (foggy in FIG. 3). After that, the controller 4 stores a command completion for each of one or more write commands corresponding to the write data in the completion queue of the host 2. The host 2 that has received the command completion from the controller 4 can reuse a storage area in the system memory 31, which stores write data associated with a write command corresponding to the command completion, to write other write data. Since a command to be issued to the SSD 3 through the submission queue may have a time limit, the controller 4 transmits the command completion to the host 2 in response to completion of the foggy-write operation (that is, without waiting for completion of the fine-write operation).

Since the SSD 3 does not include a write buffer such as a DRAM, the write data used in the foggy-write operation cannot be maintained until the start of the fine write operation for the write destination word line. The controller 4 thus writes (saves) the same data as the write data read from the system memory 31 to the HMB 32 (HMB/MWr in FIG. 3). The reason why the controller 4 saves the write data in the HMB 32 is to prevent this write data from being updated accidentally by the host 2. Since the host 2 basically does not write any data to the HMB 32, the controller 4 can prevent the write data from being updated accidentally by saving the write data in the HMB 32.

When the fine write operation for the write destination word line for which the foggy write operation has been performed becomes executable, the controller 4 reads the write data again from the HMB 32 (HMB/MRd in FIG. 3).

After that, the controller 4 transfers the data, which is read from the HMB 32, to the NAND flash memory 5 again, and instructs the NAND flash memory 5 to perform the fine write operation for writing the write data again to the plurality of memory cells connected to the write destination word line (fine in FIG. 3).

As described above, in the first embodiment, even when the SSD 3 is configured to include no write buffer, the use of the HMB 32 makes it possible to perform a multi-step write operation for the QLC flash memory.

Second Embodiment

Next, a second embodiment will be described. The SSD 3 according to the second embodiment is configured to reduce the number of times required to transfer the same write data between the SSD 3 and the memory 102 of the host 2. The hardware configuration of the SSD 3 according to the second embodiment is similar to that of the SSD 3 according to the first embodiment illustrated in FIG. 1. In the second embodiment, the host 2 notifies the SSD 3 of a write request using a request flag in place of a write command used in the first embodiment. In the second embodiment, the write control unit 21 described with reference to FIG. 1 does not control a data write operation based on the write command from the host 2, but rather based on each of request flags that are set in the HMB 32 by the host 2.

In the second embodiment, furthermore, write data is stored not in the system memory 31 but in the HMB 32 by the host 2. The write control unit 21 thus acquires the write data from the HMB 32 to perform a first-step write operation. Even when the first-step write operation is completed, the write control unit 21 need not save the write data in the HMB 32. When a second-step write operation for the word line in which the first-step write operation has been performed becomes executable, the write control unit 21 acquires the write data used in the first-step write operation for the word line again from the HMB 32.

As in the first embodiment, the read control unit 22 described with reference to FIG. 1 controls a data read operation based on a read command from the host 2.

In the SSD 3 according to the second embodiment, upon receiving from the host 2 a command (identify command) for confirming whether the controller 4 supports a function of using a host memory buffer, the controller 4 notifies the host 2 that the function of using the host memory buffer is supported by the controller 4 and that the host 2 is permitted to write data to the HMB 32.

When the SSD 3 permits the host 2 to write data to the HMB 32, the host 2 stores write data in the HMB 32, not in the system memory 31. The host 2 also notifies the SSD 3 of a write request by setting a request flag to the HMB 32. In the SSD 3 according to the second embodiment, therefore, the HMB 32 is used not as a storage area dedicated to the SSD 3, but as a storage area to which the host 2 is permitted to write data. Details of the request flag will be described later with reference to FIG. 5.

Figure 4:
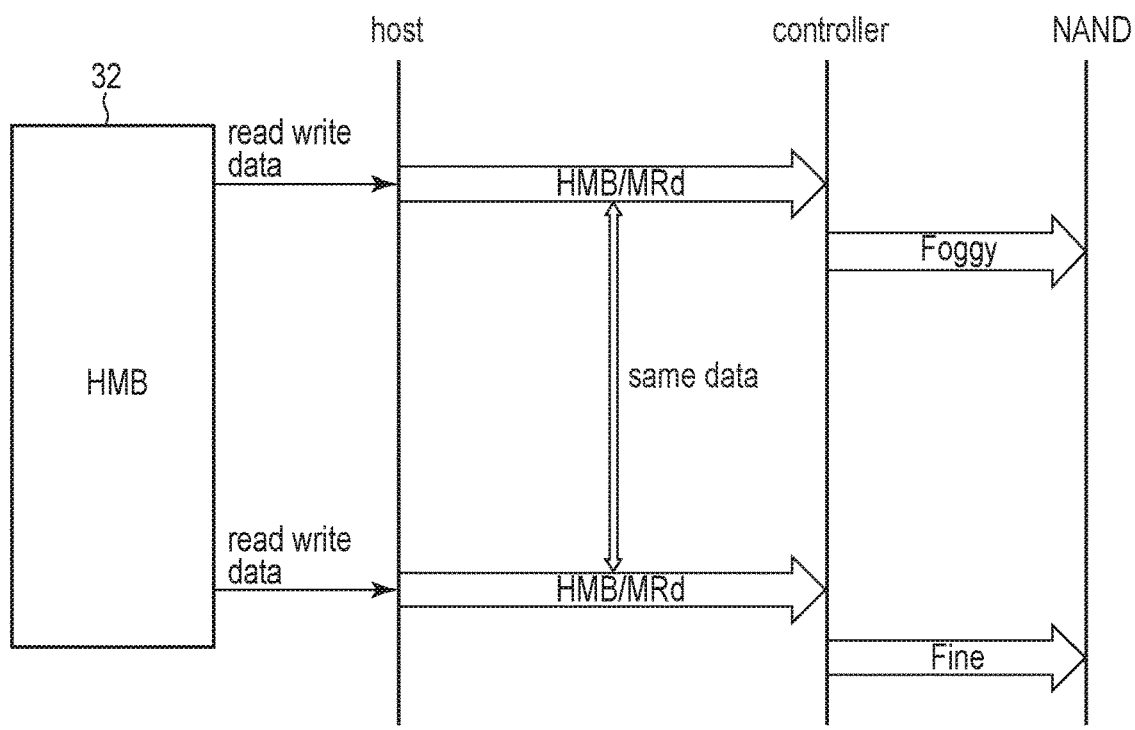
FIG. 4 is a diagram illustrating a write control operation performed in a memory system according to a second embodiment.

FIG. 4 is a diagram illustrating a write control operation performed in the SSD 3 according to the second embodiment.

First, when the total size of one or more write data associated with one or more write requests each specified by a request flag, reaches the write size (e.g., size of four pages) of the NAND flash memory 5, the controller 4 reads the one or more write data from the HMB 32 (HMB/MRd in FIG. 4). Then, the controller 4 transfers write data having a size of the write size and including the read one or more write data to the NAND flash memory 5, and instructs the NAND flash memory 5 to perform the foggy write operation for writing the write data having the size of the write size to a plurality of memory cells connected to a write target word line.

When the fine write operation for this word line becomes executable (startable), the controller 4 reads the same write data as the write data used in the foggy write operation for this word line again from the HMB 32 (HMB/MRd in FIG. 4).

Then, the controller 4 transfers the write data, which is read from the HMB 32, to the NAND flash memory 5 again, and instructs the NAND flash memory 5 to perform the fine write operation for writing the write data again to the memory cells connected to this word line.

As described above, the second embodiment does not require the operation of saving write data in the HMB 32 of the host 2. Thus, as compared with the first embodiment, the number of times the same write data is transmitted and received between the host 2 and the SSD 3 can be decreased.

Thus, as compared with the first embodiment, a bus bandwidth between the host 2 and the SSD 3 consumed for the transfer of write data between the host 2 and the SSD 3 can be decreased more than that in the first embodiment. Therefore, it is possible to prevent an increase in power consumption of the SSD 3 and a decrease in performance of the SSD 3 caused by an increase in the consumed bus bandwidth.

FIG. 5 is a diagram illustrating an example of a configuration of each of a request flag table and an address/size table which are placed in the HMB 32 by the host 2.

The host 2 transmits a command (identify command) for confirming whether the controller 4 supports a function of using a host memory buffer to the SSD 3 and whether the SSD 3 permits the host 2 to write data to the HMB 32. When the controller 4 supports the function and when the SSD 3 permits the host 2 to write data to the HMB 32, the host 2 allocates a part of the memory 102 as the HMB 32 and further places, as illustrated in FIG. 5, a request flag table 41 and an address/size table 42 in the HMB 32.

The request flag table 41 is used to realize a mechanism similar to issuance of write commands from the host 2 to the SSD 3 and notification of command completions from the SSD 3 to the host 2, by using the HMB 32.

The request flag table 41 includes a plurality of request flags. The request flag table 41 includes, for example, 32 request flags. Each of the request flags is set to either a first value or a second value. Below is a case where the first value is "1" and the second value is "0".

Each of the request flags is composed of one bit representing "1" or "0". The request flag set to the first value ("1") is used as a write request to request the SSD 3 to write data. That is, the request flag indicating "1" requests the SSD 3 to write data.

The request flag set to the second value ("0") indicates that the processes of the write request specified by this request flag have been completed. That is, the request flag indicating "0" indicates that an area in the HMB 32 where write data associated with the write request specified by this request flag is stored is available for writing new write data.

The operation of setting each of the request flags to "1" is performed by the host 2. The request flag in the state of "1" indicates that a write request is being generated (req). The operation of resetting each of the request flags to "0" is performed by the controller 4. The request flag in the state of "0" indicates that the write request has been completed (cmp). Note that the initial value of each request flag is "0".

In the example of FIG. 5, the request flag table 41 includes bitmap data having a bit length of 32 bits corresponding to 32 request flags f1 to f32. The host 2 can notify the SSD 3 of 32 write requests simultaneously using the request flags f1 to f32 of the request flag table 41.

The address/size table 42 includes 32 entries corresponding one-to-one to the 32 request flags f1 to f32. The area in the HMB 32 where the address/size table 42 is placed may be continuous with the area in the HMB 32 where the request flag table 41 is placed.

In FIG. 5, an address (start address) indicating a location of the request flag table 41 in the HMB 32 is represented as a "table address". By adding the size of the request flag table 41 to the "table address", an address indicating a location of the address/size table 42 in the HMB 32 is obtained. The 32 entries in the address/size table 42 each have the same size.

Each of the 32 entries included in the address/size table 42 is used to store (i) an address of the HMB 32 where write data associated with a write request specified by the request flag corresponding to this entry is stored, and (ii) size information indicating the size of this write data.

Each of the 32 entries may also be used to store information (+α) indicative of another parameter included in a write request specified by the request flag corresponding to this entry. An example of the information (+α) is a start logical address (start LBA) in the logical address space of the SSD 3 to which write data is to be written.

After placing the request flag table 41 and the address/size table 42 in the HMB 32, the host 2 resets each of the 32 request flags f1 to f32 in the request flag table 41 to an initial value ("0"). The fact that all of the request flags f1 to f32 are "0" indicates that the HMB 32 has no write data which has not been completely written to the SSD 3.

Thus, a state in which all of the request flags f1 to f32 are "0" indicates that the host 2 can write data (write data), which is to be written to the SSD 3, to any area in the HMB 32 other than the area where the request flag table 41 or the address/size table 42 is placed.

After the host 2 resets each of the 32 request flags f1 to f32 in the request flag table 41 to "0", the host 2 notifies the SSD 3 of an address (table address) indicating a location of the request flag table 41 in the HMB 32 and the size of the request flag table 41. The SSD 3 can thus access the request flag table 41 and the address/size table 42 subsequent to the request flag table 41.

That is, the controller 4 of the SSD 3 can perform a read access to the HMB 32 based on the address of the request flag table 41 and the size of the request flag table 32 to acquire the 32 request flags f1 to f32 from the HMB 32.

The controller 4 can also identify an address indicating a location of the address/size table 42 in the HMB 32 and an address of each entry of the address/size table 42, based on the address and size of the request flag table 41. The controller 4 can thus acquire from the address/size table 42 (i) an address indicating a location in the HMB 32 where write data associated with a request flag set to "1" is stored, and (ii) size information indicating the size of this write data.

When an operation of writing the write data associated with a request flag set to "1" to the NAND flash memory 5 (both the foggy write operation and the fine write operation) is completed, the controller 4 resets this request flag to "0".

Similarly, the host 2 can determine which storage area in the HMB 32 is being used for storing write data or is available for storing new write data by referring to the request flag table 41 and the address/size table 42. That is, the host 2 can identify an area in the HMB 32 which is available for writing new write data (i.e., free area) by referring to the request flag table 41 and the address/size table 42.

In this manner, unlike in the first embodiment, the host 2 can also identify individual areas in the HMB 32 that are available for writing data, by referring to the request flag table 41 and the address/size table 42. The host 2 can thus place write data to be written to the SSD 3 in the HMB 32.

To issue a write request for requesting writing of write data to the NAND flash memory 5, the host 2 first stores write data associated with the write request in the HMB 32.

Then, the host 2 stores an address indicating a location in the HMB 32 where the write data is stored and a data size of the write data, in an entry of the address/size table 42 corresponding to a request flag which is selected from request flags set to a state indicating cmp (i.e., request flags set to "0"). After that, the host 2 sets the selected request flag in a state indicating req. That is, the host 2 sets the selected request flag to "1".

For example, when the host 2 writes write data D1 associated with a certain write request to an address 0xXXXX in the HMB 32, the host 2 writes the address 0xXXXX and size information indicating size J of the write data D1 to an entry (here, entry 1) of the address/size table 42 corresponding to a certain request flag (here, request flag f1) set to a state indicating cmp. Then, the host 2 sets the request flag f1 to a state indicating req.

When the host 2 writes write data D2 associated with a certain write request to an address 0xYYYY in the HMB 32, the host 2 writes the address 0xYYYY and size information indicating size K of the write data D2 to an entry (here, entry 2) of the address/size table 42 corresponding to a certain request flag (here, request flag f2) set to a state indicating "0" (cmp). Then, the host 2 sets the request flag f2 to a state indicating req.

When the host 2 writes write data D32 associated with a certain write request to an address 0xZZZZ in the HMB 32, the host 2 writes the address 0xZZZZ and size information indicating size L of the write data D32 to an entry (entry 32) of the address/size table 42 corresponding to a certain request flag (here, request flag f32) set to a state indicating cmp. Then, the host 2 sets the request flag f32 to a state indicating req.

The controller 4 determines a state of each request flag by referring to the request flag table 41. In response to one or more request flags being set to a state indicating req, the controller 4 detects that the host 2 generates one or more write requests. When the writing of one or more write data associated with one or more request flags indicating req (both the foggy write operation and the fine write operation) is completed, the controller 4 sets each of the one or more request flags to a state indicating cmp. Thus, the controller 4 resets the one or more request flags.

Next is a detailed description of a multi-step write operation performed in the SSD 3 according to the second embodiment.

Figure 6A:
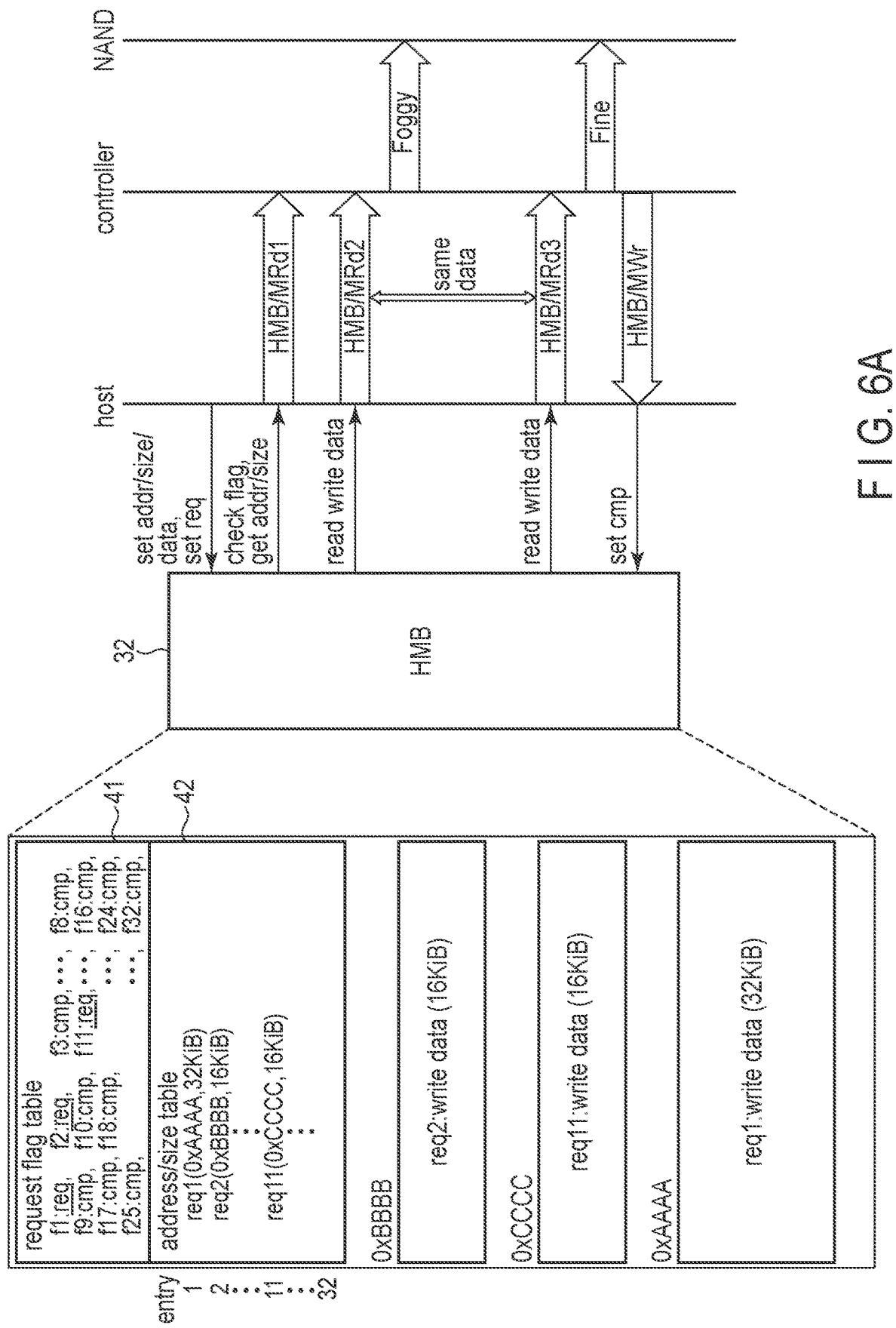
FIG. 6A is a diagram illustrating details of the write control operation performed in the memory system according to the second embodiment.

FIG. 6A is a diagram illustrating details of a write control operation performed in the SSD 3 according to the second embodiment.

First, the host 2 stores (i) write data associated with a write request req1 corresponding to the request flag f1, (ii) write data associated with a write request req2 corresponding to the request flag f2, and (iii) write data associated with a write request req11 corresponding to the request flag f11, in the HMB 32, and stores addresses indicating the locations in the HMB 32 where the three write data are respectively stored and size information of the three write data, in three entries of the address/size table 42 ("set addr/size/data" in FIG. 6A).

Entry 1 stores (i) an address (0xAAAA) of the HMB 32 where write data associated with write request req1 corresponding to the request flag f1 is stored, and (ii) size information indicating the size (32 KiB) of this write data. Entry 2 stores (i) an address (0xBBBB) of the HMB 32 where write data associated with the write request req2 corresponding to the request flag f2 is stored, and (ii) size information indicating the size (16 KiB) of this write data. Entry 11 stores (i) an address (0xCCCC) of the HMB 32 where write data associated with the write request req11 corresponding to the request flag f11 is stored, and (ii) size information indicating the size (16 KiB) of this write data.

To notify the controller 4 that the write requests req1, req2 and req11 have been generated, the host 2 sets each of these requests to a state ("1") indicating req ("set req" in FIG. 6A).

The controller 4 refers to the request flag table 41 to check whether there is a request flag set to req ("check flag" in FIG. 6A). Then, the controller 4 acquires (i) an address of the HMB 32 where write data corresponding to each of the request flags set to req is stored, and (ii) size information of the write data, by referring to each of the entries of the address/size table 42 corresponding to each of the request flags set to req ("get addr/size" in FIG. 6A). In these operations ("check flag, get addr/size" in FIG. 6A), the controller 4 reads information of each table from the HMB 32 (HMB/MRd1 in FIG. 6A).

Since each of the request flag f1, the request flag f2 and the request flag f11 is set to a state indicating req, the controller 4 acquires information stored in each of entries 1, 2 and 11 from the HMB 32.

Assume here that the write size of the NAND flash memory 5 is 64 KiB. The controller 4 determines, based on the size information of each write data acquired from the address/size table 42, whether the total size of the write data is 64 KiB or more. Since the total size of three write data corresponding to the request flags f1, f2 and f11 is 64 KiB, the controller 4 reads the three write data from the HMB 32 ("read write data, HMB/MRd2" in FIG. 6A). Then, the controller 4 transfers the read three write data to the NAND flash memory 5 as a write data having a size of 64 KiB, and instructs the NAND flash memory 5 to perform the foggy write operation for writing the write data having the size of 64 KiB to a plurality of memory cells connected to a first word line which is a write destination (foggy in FIG. 6A).

Even when the foggy write operation is completed, the controller 4 does not update the request flag table 41 to maintain each of the request flags f1, f2 and f11 in req ("1").

After a while, when the fine write operation for the first word line becomes executable, the controller 4 reads the three write data from the HMB 32 again as the write data having the size of 64 KiB ("read write data, HMB/MRd3" in FIG. 6A). In this case, in response to the completion of the foggy write operation for the second word line adjacent to the first word line, the controller 4 may determine that the fine write operation for the first word line becomes executable (startable). The write data to be read at this time are the three write data read from the HMB 32 in the foggy write operation for the first word line.

Then, the controller 4 transfers the three write data which are read from the HMB 32 to the NAND flash memory 5 as the write data having the size of 64 KiB, and instructs the NAND flash memory 5 to perform the fine write operation for writing the write data again to the memory cells connected to the first word line (fine in FIG. 6A).

When the fine write operation is completed, the controller 4 resets each of the request flags corresponding to the write requests for which the write operation is completed to "0", and thereby setting each of the request flags to a state indicating cmp ("HMB/MWr, set cmp" in FIG. 6A). Specifically, the controller 4 sets each of the request flags f1, f2 and f11 to a state indicating cmp ("0") and thus resets each of these request flags to the initial state.

Figure 6B:
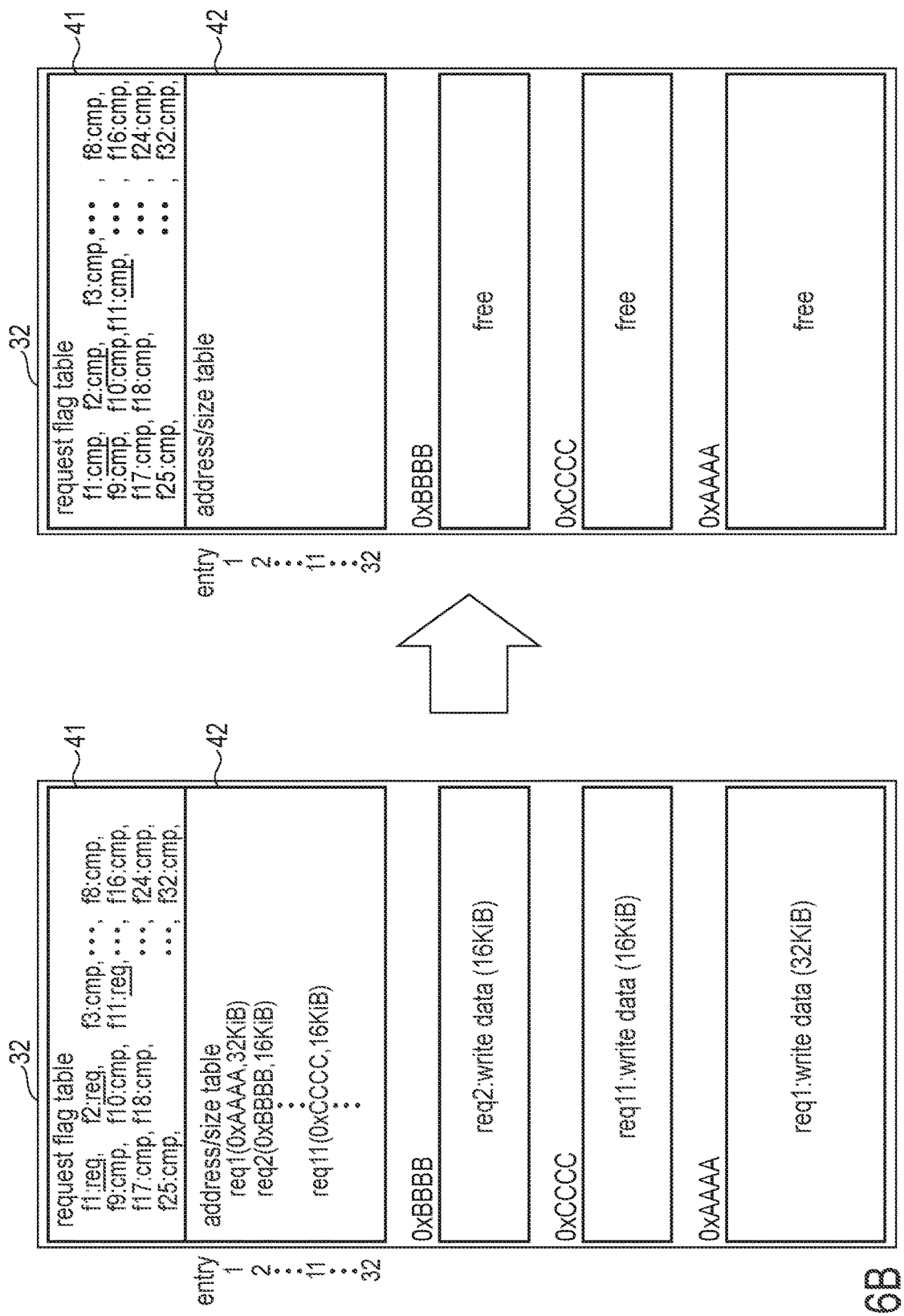
FIG. 6B is a diagram illustrating an operation of updating the request flag table in the host memory buffer, which is performed by the memory system according to the second embodiment.

FIG. 6B is a diagram illustrating an operation of updating the request flag table 41 in the host memory buffer 32, which is performed by the SSD 3 according to the second embodiment.

The controller 4 performs a write access to the request flag table 41 to reset each of the request flags f1, f2 and f11 to a state indicating cmp.

When each of the request flags f1, f2 and f11 is reset to a state indicating cmp, three areas in the HMB 32 where three write data associated with the request flags f1, f2 and f11 are respectively stored become free areas capable of storing new write data.

FIG. 7 is a sequence diagram illustrating a process of initializing the host memory buffer, which is performed by the host 2 and the SSD 3 according to the second embodiment.

First, the host 2 transmits to the SSD 3 an identify command to confirm whether the SSD 3 supports the function of using the host memory buffer (step S101).

Upon receiving the identify command from the host 2, the controller 4 of the SSD 3 notifies the host 2 that the SSD 3 supports the function of using the host memory buffer, the size of the HMB 32 to be created, and that the host 2 is permitted to write data to the HMB 32 (step S102). Information indicating that the host 2 is permitted to write data to the HMB 32 may be stored in a specific register in the controller 4 from which the host 2 can read data. The host 2 can determine whether the host 2 is permitted to write data to the HMB 32 by reading the information from the register.

Upon receiving the above notification from the SSD 3 in step S102, the host 2 allocates a part of the memory area of the memory 102 as the HMB 32 that can be used by the SSD 3 (step S103). The size of the HMB 32 to be allocated is determined based on the size specified by the SSD 3 in step 102.

Furthermore, when the host 2 has received permission of write to the HMB 32, the host 2 places the request flag table 41 and the address/size table 42 in the HMB 32, and resets each of the request flags in the request flag table 41 to the initial state "0", that is, a state indicating cmp (step S104).

The host 2 notifies the SSD 3 of a start address indicating a location of the HMB 32 allocated in the memory 102, the size of the HMB 32, a start address indicating a location of the request flag table 41 in the HMB 32, and the size of the request flag table 41 (step S105). The SSD 3 recognizes the number of request flags managed by the request flag table 41 from the size of the request flag table 41.

Figure 8:
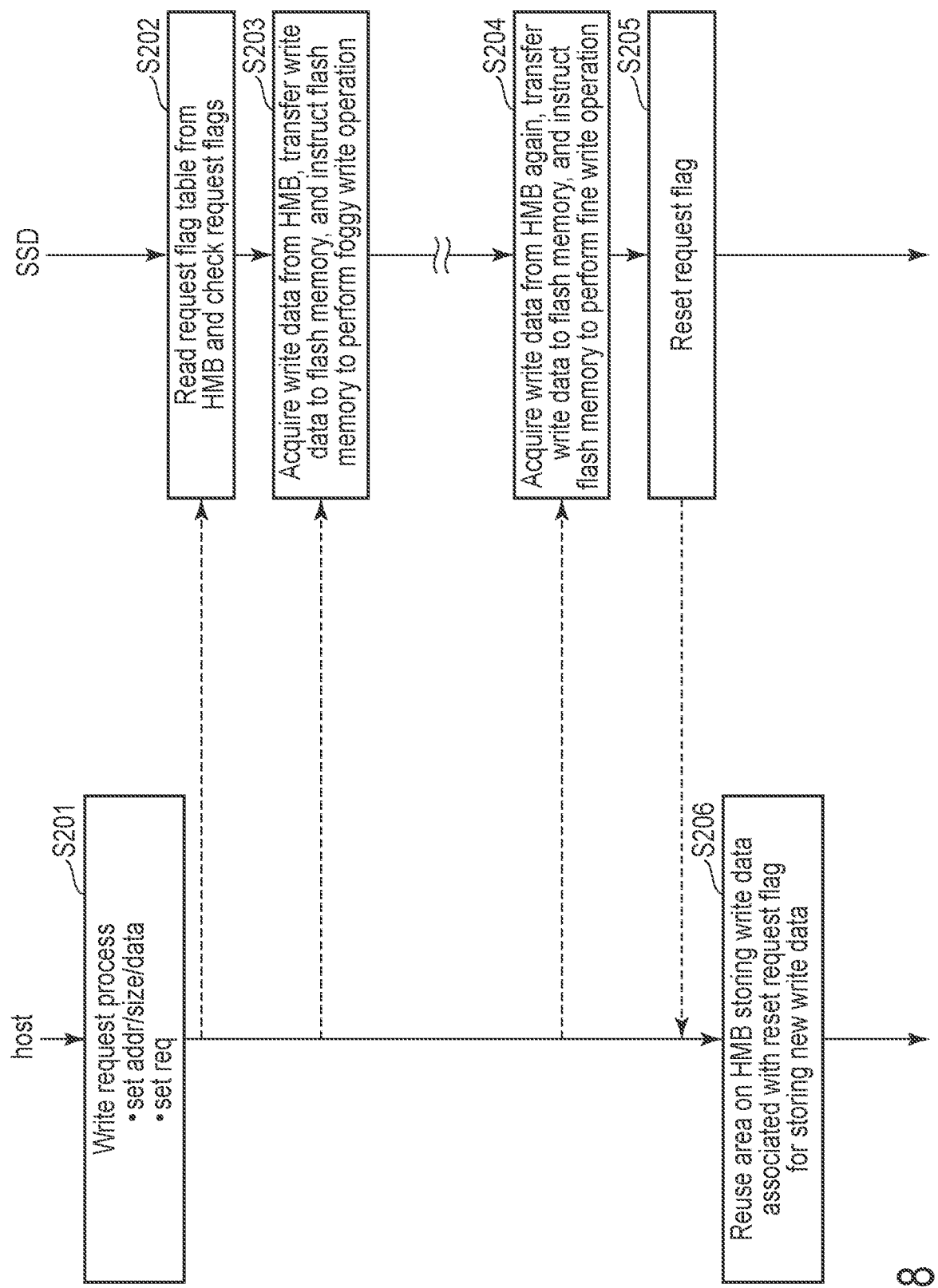
FIG. 8 is a sequence diagram illustrating a foggy-fine write operation performed in the memory system according to the second embodiment.

FIG. 8 is a sequence diagram illustrating the foggy-fine write operation performed in the SSD 3 according to the second embodiment.

First, the host 2 performs a write request process for generating a write request (step S201). In the step S201, the host 2 stores write data associated with a write request to be generated in the HMB 32, and stores (i) an address indicating a location in in the HMB 32 where the write data is stored and (ii) the size of the write data, in an entry of the address/size table 42 ("set addr/size/data" in step S201). Then, the host 2 sets a request flag corresponding to the write request to "1", that is, a state indicating req ("set req" in step S201).

The controller 4 of the SSD 3 reads the request flag table 41 from the HMB 32 and checks the state of each of the request flags included in the request flag table 41 (step S202). The controller 4 may check the request flag table 41 periodically, or an algorithm may be prepared to determine timing of the check.

Alternatively, when the host 2 newly sets one or more request flags to "1", the host 2 may store, in a specific register in the controller 4, information indicating that a new write request has been set in the request flag table 41. In response to the information being stored in the specific register, the controller 4 may start an operation of checking the request flag table 41.

When there is a request flag indicating req, the controller 4 acquires information of write data corresponding to the request flag from the address/size table 42 by referring to an entry of the address/size table 42 corresponding to the request flag indicating req.

In addition, when the total size of one or more write data associated with one or more request flags indicating req is equal to or larger than the write size (64 KiB) of the NAND flash memory 5, the controller 4 of the SSD 3 acquires the one or more write data whose total size is the write size (64 KiB) from the HMB 32, transfers the acquired one or more write data to the NAND flash memory 5 as the write data having the write size (64 KiB), and instructs the NAND flash memory 5 to perform the foggy write operation of writing the write data having the write size (64 KiB) to a plurality of memory cells connected to a write destination word line (step S203).

After a while, when the fine write operation for the word line for which the foggy write operation has been performed in step 203 becomes executable, the controller 4 of the SSD 3 acquires the one or more write data again as the write data having the write size (64 KiB) from the HMB 32, transfers the write data having the write size (64 KiB) to the NAND flash memory 5 again, and instructs the NAND flash memory 5 to perform the fine write operation for writing the write data having the write size (64 KiB) again to the plurality of memory cells connected to the word line for which the foggy write operation has been performed (step S204).

The controller 4 of the SSD 3 resets the one or more request flags associated with the one or more write requests for which the fine write operation has been completed, to "0", that is, to a state indicating cmp (step S205).

When a certain request flag is reset, the host 2 reuses the memory area in the HMB 32 where the write data associated with the reset request flag is stored as a memory area for storing new write data (step S206).

Figure 9:
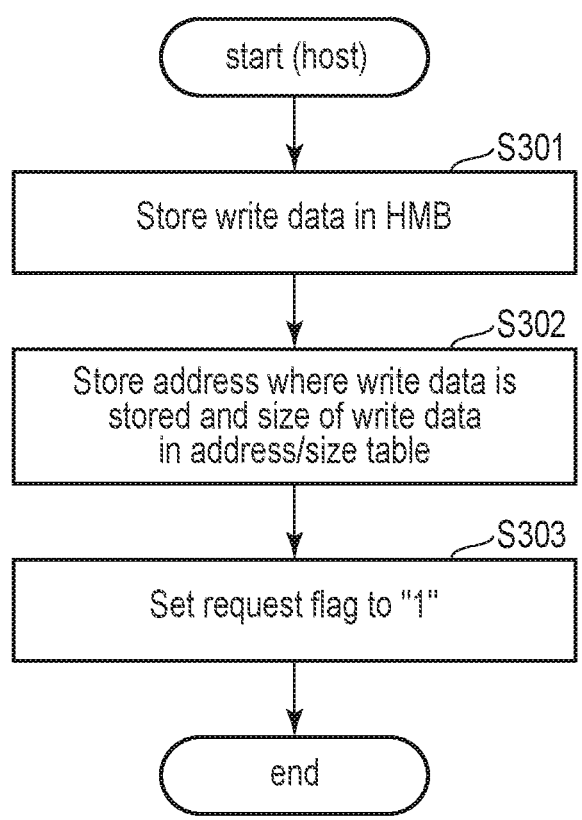
FIG. 9 is a flowchart illustrating a procedure of a write request process performed in the host for the memory system according to the second embodiment.

FIG. 9 is a flowchart illustrating a procedure of the write request process performed in the host 2 for the SSD 3 according to the second embodiment.

The host 2 identifies free areas in the HMB 32 by referring to the request flag table 41 and the address/size table 42, and stores write data in a certain free area in the HMB 32 (step S301).

Then, the host 2 selects one of the request flags that have been reset, and stores a start address indicating a location of the write data stored in the HMB 32 and size information of the write data, in an entry of the address/size table 42 corresponding to the selected request flag (step S302). The host 2 may store, in addition to the start address and size information, a start logical address (start LBA) in the logical address space of the SSD 3, to which the write data is to be written, or the like, in an entry of the address/size table 42 corresponding to the selected request flag.

Then, the host 2 sets the selected request flag to "1" (step S303). The request flag set to "1" indicates req.

Figure 10:
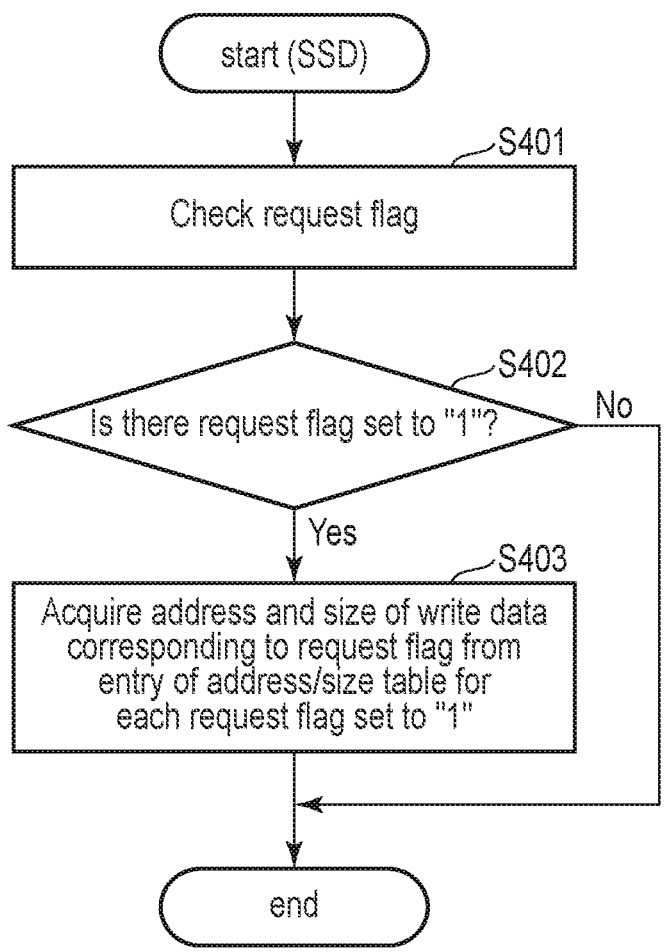
FIG. 10 is a flowchart illustrating a procedure of a process of checking the request flag table, which is performed by the memory system according to the second embodiment.

FIG. 10 is a flowchart illustrating a procedure of a process of checking the request flag table 41, which is performed by the SSD 3 according to the second embodiment.

The controller 4 checks request flags (step S401). In the step S401, the controller 4 accesses the HMB 32 and refers to the request flag table 41. The controller 4 may acquire bit map data (a plurality of request flags) from the request flag table 41 and check a state indicated by each request flag based on the bit map data acquired from the request flag table 41.

The controller 4 determines whether there is a request flag set to "1" (step S402). That is, the controller 4 determines whether there is a request flag indicating req in the request flag table 41, based on the information (bit map data) of the request flag table 41 acquired in step S401.

When there is a request flag set to "1" (Yes in step S402), the controller 4 acquires, for each request flag set to "1", the address of the HMB 32 where write data corresponding to the request flag is stored, and size information of the write data corresponding to the request flag, from the entry of the address/size table 42 (step S403).

When there is no request flag set to "1" (No in step S402), the controller 4 terminates the process of checking the request flags.

FIG. 11 is a flowchart illustrating a procedure of a write control operation of controlling the foggy write operation, which is performed in the SSD 3 according to the second embodiment.

The controller 4 determines whether the total size of one or more write data corresponding to one or more request flags set to "1" reaches the write size (step S501). Based on the size information of each write data acquired from the address/size table 42, the controller 4 obtains the total size of the one or more write data. Then, the controller 4 determines whether the total size of the one or more write data reaches the write size, which allows the foggy write operation to be performed.

When the total size of the one or more write data reaches the write size (Yes in step S501), the controller 4 reads the one or more write data as write data having the write size from the HMB 32 (step S502). The controller 4 may acquire addresses indicating memory areas in the HMB 32 where the one or more write data are respectively stored, and one or more size information of the one or more write data, in advance, from the address/size table 42.

The controller 4 transfers the one or more write data as the write data having the write size to the NAND flash memory 5, and instructs the NAND flash memory 5 to perform the foggy write operation (step S503). In step S503, the controller 4 specifies a first word line of write destination and instructs the NAND flash memory 5 to perform the foggy write operation. The NAND flash memory 5 performs the foggy write operation of writing the write data having the write size to the first word line.

When the total size of the one or more write data does not reach the write size (No in step S501), the controller 4 terminates the foggy write control operation.

Figure 12:
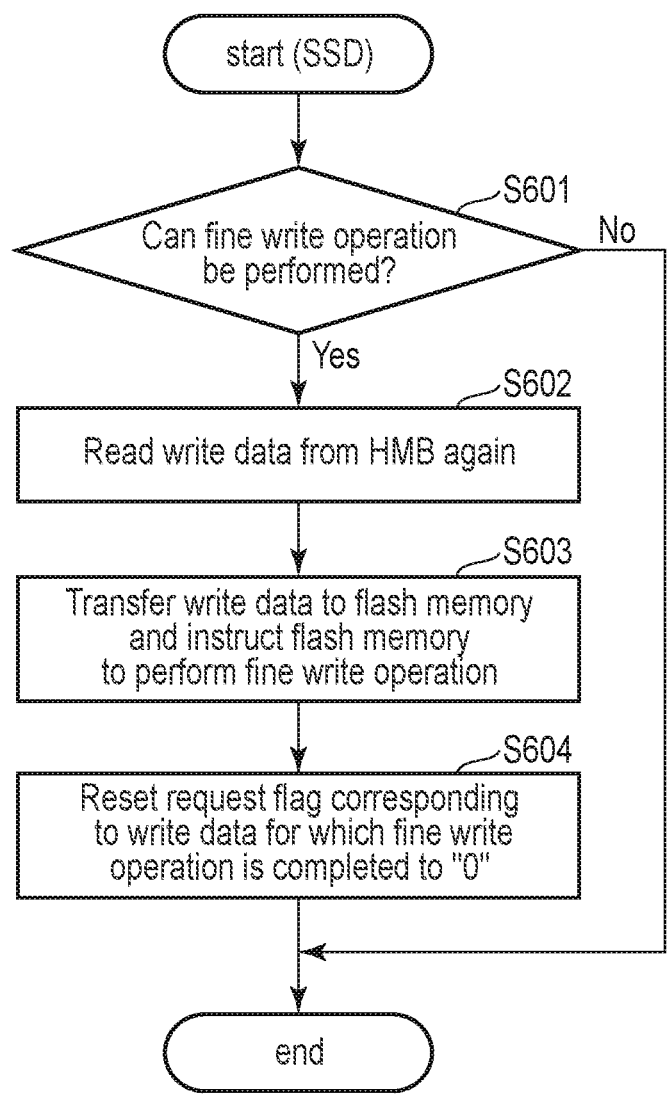
FIG. 12 is a flowchart illustrating a procedure of a write control operation of controlling a fine write operation, which is performed in the memory system according to the second embodiment.

FIG. 12 is a flowchart illustrating a procedure of a write control operation of controlling the fine write operation, which is performed in the SSD 3 according to the second embodiment.

The procedure will be described, paying attention to a write control operation of controlling the fine write operation for the first word line to which write data has been written in the foggy write operation in step S503.

The controller 4 determines whether the fine write operation for the first word line becomes executable (startable) (step S601). When the foggy write operation is completed for a second word line adjacent to the first word line for which the foggy write operation has been once performed, the controller 4 may determine that the fine write operation for the first word line becomes executable.

When the fine write operation for the first word line becomes executable (Yes in step S601), the controller 4 reads the one or more write data, which have been used in the foggy write operation for the first word line, from the HMB 32 again (step S602). That is, the one or more write data read from the HMB 32 are the same as the one or more write data for which the foggy write operation has been performed once.

The controller 4 transfers the one or more write data as the write data having the write size to the NAND flash memory 5 and instructs the NAND flash memory 5 to perform the fine write operation (step S603).

When the fine write operation is completed, the controller 4 resets the one or more request flags corresponding to the one or more write data for which the fine write operation is completed to "0" (step S604). The controller 4 resets the one or more request flags to notify the host 2 that the fine write operation is completed. When each of the one or more request flags is reset, the host 2 determines that the one or more write data for which the fine write operation has been performed need not be stored in the HMB 32 anymore.

When the fine write operation cannot be started (No in step S601), the controller 4 terminates the fine write control operation.

As described above, according to the second embodiment, in response to the host 2 setting one or more of request flags included in the request flag table 41 in the HMB 32 defined by the NVMe standard to "1" that requests the SSD 3 to write data, the controller 4 detects that a write request has been issued.

When the total size of one or more write data associated with the one or more request flags set to "1" reaches the write size, the controller 4 reads the one or more write data from the HMB 32. In this case, the controller 4 acquires, from one or more entries of the address/size table 42 corresponding to the one or more request flags set to "1", one or more addresses where one or more write data associated with the one or more request flags are respectively stored and one or more size information of the one or more write data. Then, the controller 4 transfers the read one or more write data as first write data having the write size to the NAND flash memory 5 and instructs the NAND flash memory 5 to perform a first-step write operation for writing the first write data to the memory cells connected to a write destination word line.

When a second-step write operation for the write destination word line becomes executable (startable), the controller 4 reads the one or more write data, which have been used in the first-step write operation for the write destination word line, from the HMB 32 again. The controller 4 transfers the read one or more write data as the first write data to the NAND flash memory 5 again, and instructs the NAND flash memory 5 to perform a second-step write operation for writing the first write data again to the memory cells connected to the write destination word line.

In the first-step write operation, the NAND flash memory 5 sets the threshold voltage of each of the memory cells connected to the write destination word line coarser than a target threshold voltage distribution. In the second-step write operation, the NAND flash memory 5 sets (adjusts) the threshold voltage of each of the memory cells such that the threshold voltage of each of the memory cells becomes the target threshold voltage distribution.

Upon completion of the second-step write operation, the SSD 3 accesses the HMB 32 to reset each of the request flags corresponding to the one or more write data whose second-step write operations have been completed to "0". Thus, areas in the HMB 32 where the one or more write data corresponding to one or more request flags set to "0" are stored are available for storing new write data, viewed from the host 2.

Therefore, the host 2 can determine, for each of the areas in the HMB 32 where write data associated with write requests are stored, whether the area in the HMB 32 is an area in use for storing the write data or a free area available for storing new write data, by referring to each of the request flags. In other words, the host 2 can easily identify each part of the memory area of the HMB 32, which is used by the SSD 3 (i.e., used area), and the other part not used by the SSD 3 (i.e., free area). The free area in the HMB 32 not used by the SSD 3 can be used by the host 2 for storing new write data.

An area in the HMB 32 where write data associated with each write request is stored has the same size as that of the write data. Thus, even if the size of write data associated with one write request is large, the controller 4 can change a specific area in the HMB 32 having the same size as that of the write data from the used area to the free area only by resetting one request flag corresponding to the write request.

Therefore, in the second embodiment, even when the SSD 3 is configured to include no write buffer, the use of the HMB 32 makes it possible to perform a multi-step write operation for the QLC flash memory. In addition, as compared with the first embodiment, the number of times the same write data is transmitted and received between the host 2 and the SSD 3 can be decreased. Thus, as compared with the first embodiment, a bus bandwidth between the host 2 and the SSD 3 consumed for the transfer of write data can be decreased. Therefore, it is possible to prevent an increase in power consumption of the SSD 3 and a decrease in performance of the SSD 3 caused by an increase in the consumed bus bandwidth.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a nonvolatile memory, the nonvolatile memory including a plurality of word lines each connecting a plurality of memory cells, the nonvolatile memory being configured to write data having a first size to the plurality of memory cells connected to one word line by performing a multi-step write operation, the multi-step write operation including at least a first-step write operation and a second-step write operation, the method comprising:

communicating with a host in accordance with an interface standard, the host including a host memory, the interface standard defining that a location of the host memory is allowed to be accessed by specifying the location using an address;

permitting the host to write data to a first portion of the host memory;

acquiring, from the first portion of the host memory, first write data having the first size and including one or more write data respectively associated with one or more write requests;

transferring the first write data to the nonvolatile memory;

instructing the nonvolatile memory to perform the first-step write operation for writing the first write data to the plurality of memory cells connected to a first word line; and when the second-step write operation for the first word line becomes executable:
acquiring the first write data again from the first portion of the host memory;
transferring the first write data again to the nonvolatile memory; and
instructing the nonvolatile memory to perform the second-step write operation for writing the first write data again to the plurality of memory cells connected to the first word line;

in response to one or more request flags being set to a first value by the host, the one or more request flags being among a plurality of request flags included in a first table stored in the host memory, recognizing the one or more write requests by acquiring the plurality of request flags from the host memory based on an address indicating a location of the first table in the host memory and a size of the first table, which are notified from the host; and in response to completion of the second-step write operation for the first word line, resetting each of the one or more request flags to a second value indicating that an area in the first portion of the host memory where corresponding write data is stored is available for writing new write data, wherein each of the one or more write data is written to the first portion of the host memory by the host after the host is permitted to write data to the first portion of the host memory.

2. The method of claim 1, further comprising:
acquiring, from a second table stored in the host memory, (i) one or more addresses indicating one or more locations in the first portion of the host memory where the one or more write data respectively associated with the one or more request flags each set to the first value are stored, and (ii) one or more size information indicating respective sizes of the one or more write data; and
acquiring the one or more write data from the first portion of the host memory as the first write data, based on the acquired one or more addresses and the acquired one or more size information.

3. The method of claim 2, wherein:
the second table includes a plurality of entries respectively corresponding to the plurality of request flags in the first table, and
the one or more addresses and the one or more size information are acquired from one or more entries of the second table respectively corresponding to the one or more request flags each set to the first value.

4. The method of claim 1, wherein the first size is a size obtained by multiplying the number of the plurality of memory cells connected to each of the plurality of word lines by the number of bits stored per memory cell.

5. The method of claim 1, wherein
the first-step write operation is a write operation for setting a threshold voltage of each of the plurality of memory cells connected to the one word line coarser than a target threshold voltage distribution, and
the second-step write operation is a write operation for adjusting the threshold voltage of each of the plurality of memory cells such that the threshold voltage of each of the plurality of memory cells becomes the target threshold voltage distribution.

6. The method of claim 1, wherein between the host issuing the one or more write requests and completion of the one or more write requests being notified to the host, the host is not allowed to write data to the first portion of the host memory.

7. The method of claim 1, wherein the interface standard is a standard of Non Volatile Memory Express (NVMe).

8. A method of controlling a nonvolatile memory, the nonvolatile memory including a plurality of word lines each connecting a plurality of memory cells, the nonvolatile memory being configured to write data having a first size to the plurality of memory cells connected to one word line by performing a multi-step write operation, the multi-step write operation including at least a first-step write operation and a second-step write operation, the method comprising:
communicating with a host in accordance with an interface standard, the host including a host memory, the interface standard defining that a location of the host memory is allowed to be accessed by specifying the location using an address;
permitting the host to write data to a first portion of the host memory;
acquiring, from the first portion of the host memory, first write data having the first size and including one or more write data respectively associated with one or more write requests;
transferring the first write data to the nonvolatile memory;
instructing the nonvolatile memory to perform the first-step write operation for writing the first write data to the plurality of memory cells connected to a first word line; and
when the second-step write operation for the first word line becomes executable:
acquiring the first write data again from the first portion of the host memory;
transferring the first write data again to the nonvolatile memory;
instructing the nonvolatile memory to perform the second-step write operation for writing the first write data again to the plurality of memory cells connected to the first word line;
in response to one or more request flags being set to a first value by the host, the one or more request flags being among a plurality of request flags included in a first table stored in the host memory, recognizing the one or more write requests;
in response to completion of the second-step write operation for the first word line, resetting each of the one or more request flags to a second value indicating that an area in the first portion of the host memory where corresponding write data is stored is available for writing new write data;
acquiring, from a second table stored in the host memory, (i) one or more addresses indicating one or more locations in the first portion of the host memory where the one or more write data respectively associated with the one or more request flags each set to the first value are stored, and (ii) one or more size information indicating respective sizes of the one or more write data; and
acquiring the one or more write data from the first portion of the host memory as the first write data, based on the acquired one or more addresses and the acquired one or more size information,
wherein each of the one or more write data is written to the first portion of the host memory by the host after the host is permitted to write data to the first portion of the host memory.

9. The method of claim 8, wherein:
the second table includes a plurality of entries respectively corresponding to the plurality of request flags in the first table, and
the one or more addresses and the one or more size information are acquired from one or more entries of the second table respectively corresponding to the one or more request flags each set to the first value.

10. The method of claim 8, wherein the first size is a size obtained by multiplying the number of the plurality of memory cells connected to each of the plurality of word lines by the number of bits stored per memory cell.

11. The method of claim 8, wherein
the first-step write operation is a write operation for setting a threshold voltage of each of the plurality of memory cells connected to the one word line coarser than a target threshold voltage distribution, and
the second-step write operation is a write operation for adjusting the threshold voltage of each of the plurality of memory cells such that the threshold voltage of each of the plurality of memory cells becomes the target threshold voltage distribution.

12. The method of claim 8, wherein between the host issuing the one or more write requests and completion of the one or more write requests being notified to the host, the host is not allowed to write data to the first portion of the host memory.

13. The method of claim 8, wherein the interface standard is a standard of Non Volatile Memory Express (NVMe).

14. A method of controlling a nonvolatile memory, the nonvolatile memory including a plurality of word lines each connecting a plurality of memory cells, the nonvolatile memory being configured to write data having a first size to the plurality of memory cells connected to one word line by performing a multi-step write operation, the multi-step write operation including at least a first-step write operation and a second-step write operation, the method comprising:
communicating with a host in accordance with an interface standard, the host including a host memory, the interface standard defining that a location of the host memory is allowed to be accessed by specifying the location using an address;
permitting the host to write data to a first portion of the host memory;
acquiring, from the first portion of the host memory, first write data having the first size and including one or more write data respectively associated with one or more write requests;
transferring the first write data to the nonvolatile memory;
instructing the nonvolatile memory to perform the first-step write operation for writing the first write data to the plurality of memory cells connected to a first word line; and
when the second-step write operation for the first word line becomes executable:

acquiring the first write data again from the first portion of the host memory;

transferring the first write data again to the nonvolatile memory; and instructing the nonvolatile memory to perform the second-step write operation for writing the first write data again to the plurality of memory cells connected to the first word line, wherein each of the one or more write data is written to the first portion of the host memory by the host after the host is permitted to write data to the first portion of the host memory, the first-step write operation is a write operation for setting a threshold voltage of each of the plurality of memory cells connected to the one word line coarser than a target threshold voltage distribution, and the second-step write operation is a write operation for adjusting the threshold voltage of each of the plurality of memory cells such that the threshold voltage of each of the plurality of memory cells becomes the target threshold voltage distribution.

15. The method of claim 14, further comprising:

in response to one or more request flags being set to a first value by the host, the one or more request flags being among a plurality of request flags included in a first table stored in the host memory, recognizing the one or more write requests; and in response to completion of the second-step write operation for the first word line, resetting each of the one or more request flags to a second value indicating that an area in the first portion of the host memory where corresponding write data is stored is available for writing new write data.

16. The method of claim 14, wherein the first size is a size obtained by multiplying the number of the plurality of memory cells connected to each of the plurality of word lines by the number of bits stored per memory cell.

17. The method of claim 14, wherein between the host issuing the one or more write requests and completion of the one or more write requests being notified to the host, the host is not allowed to write data to the first portion of the host memory.

18. The method of claim 14, wherein the interface standard is a standard of Non Volatile Memory Express (NVMe).

* * * * *